(12) United States Patent
Tomita et al.

(10) Patent No.: US 7,046,110 B2
(45) Date of Patent: May 16, 2006

(54) SUPERCONDUCTING MAGNET MADE OF HIGH-TEMPERATURE BULK SUPERCONDUCTOR AND PROCESS OF PRODUCING SAME

(75) Inventors: Masaru Tomita, Tokyo (JP); Masato Murakami, Tokyo (JP)

(73) Assignees: International Superconductivity Technology Center, The Juridical Foundation, Tokyo (JP); Railway Technical Research Institute, The Juridical Foundation, Tokyo (JP)

( * ) Notice: Subject to any disclaimer, the term of this patent is extended or adjusted under 35 U.S.C. 154(b) by 0 days.

(21) Appl. No.: 10/454,723

(22) Filed: Jun. 4, 2003

(65) Prior Publication Data

US 2003/0231091 A1    Dec. 18, 2003

(30) Foreign Application Priority Data

Jun. 12, 2002    (JP)    ............................. 2002-171336

(51) Int. Cl.
    *H01F 1/00*    (2006.01)
(52) U.S. Cl. ...................................... 335/296; 335/216
(58) Field of Classification Search ................ 335/215, 335/216, 296
    See application file for complete search history.

(56) References Cited

U.S. PATENT DOCUMENTS

| | | | |
|---|---|---|---|
| 5,167,715 A | 12/1992 | Kalafala et al. | |
| 5,384,197 A | 1/1995 | Koyama et al. | |
| 5,508,257 A * | 4/1996 | Sibata et al. | 505/452 |
| 5,708,405 A | 1/1998 | Moriyama et al. | |
| 5,827,797 A * | 10/1998 | Cass et al. | 505/430 |
| 6,083,886 A | 7/2000 | Hayashi et al. | |
| 6,175,749 B1 * | 1/2001 | Wordenweber | 505/191 |
| 6,297,199 B1 | 10/2001 | Tomita et al. | |
| 6,365,553 B1 * | 4/2002 | Tomita et al. | 505/124 |
| 6,413,624 B1 | 7/2002 | Tomita et al. | |

FOREIGN PATENT DOCUMENTS

JP        56040289 A   *   4/1981

(Continued)

OTHER PUBLICATIONS

*Effect of cryo-thermal cycles on polymer encapsulated YBCO superconductor-I. (Morphology)*, A. Malik et al., 1996, pp. 75-79.

*Primary Examiner*—Elvin G. Enad
*Assistant Examiner*—Bernard Rojas
(74) *Attorney, Agent, or Firm*—Flynn, Thiel, Boutell & Tanis, P.C.

(57) ABSTRACT

There is established a superconducting magnet made of a high-temperature bulk superconductor and capable of trapping a high magnetic field with ease and stably. The superconducting magnet made of the high-temperature bulk superconductor, for use by trapping a magnetic field, is made of the bulk superconductor provided with an artificial hole, a low melting metal impregnated into, and filling up at least the artificial hole, and a heat conducting metal material embedded with portions of the high-temperature bulk superconductor, impregnated with, and filled with the low melting metal. The superconducting magnet can be produced by a process comprising the steps of providing the artificial hole in the high-temperature bulk superconductor, disposing the heat conducting metal material in at least the artificial hole, applying a process of impregnating and filling up at least the artificial hole with the low melting metal, and subsequently, executing a process of magnetizing.

10 Claims, 1 Drawing Sheet

FOREIGN PATENT DOCUMENTS

| | | |
|---|---:|---|
| JP | 61-287190 | 12/1985 |
| JP | 61-222193 | 10/1986 |
| JP | 63-260882 | 10/1988 |
| JP | 1-261286 | 10/1989 |
| JP | 1-282176 | 11/1989 |
| JP | 3-245558 | 11/1991 |
| JP | 40324558 A | 11/1991 |
| JP | 5-78183 | 3/1993 |
| JP | 6-299087 | 10/1994 |
| JP | 3100370 | 8/2000 |
| JP | 3100375 | 8/2000 |
| JP | 3144675 | 1/2001 |

\* cited by examiner

FIG. 1

SUPERCONDUCTING MAGNET MADE OF HIGH-TEMPERATURE BULK SUPERCONDUCTOR AND PROCESS OF PRODUCING SAME

FIELD OF THE INVENTION

The present invention relates to a superconducting magnet made of a high-temperature bulk superconductor which is capable of securing a high trapped magnetic field in a relatively short time and a process of producing the same, and the invention is expected to make a great contribution to enhancement of technology in application fields, such as a magnetic levitation train, superconducting bearings for use in flywheel energy storage, and a magnetic separation apparatus, wherein utilization of the high-temperature bulk superconductor, under a high electromagnetic force, is desired.

BACKGROUND OF THE INVENTION

Following discovery of oxide superconducting materials having a relatively high critical temperature (Tc) such as $LiTi_2O_3$, $Ba(Bi, Pb)O_3$, and $(Ba, K)BiO_3$, there have lately been developed copper oxide superconducting materials one after another, such as $(La, Sr)_2 CuO_4$, $REBa_2Cu_3O_7$ (RE: rare earth element), $Bi_2Sr_2Ca_2Cu_3O_{10}$, $Ti_2Ba_2Ca_2Cu_3O_{10}$, and $HgBa_2Ca_2Cu_3O_8$ having still higher critical temperatures.

Incidentally, it has been known that although a superconducting material having a higher critical current density in comparison with an ordinary conducting material can pass a large electric current without loss as described above, there is a risk of the superconducting material being destroyed depending upon its strength in the case where such a large electric current is passed therethrough because a large electromagnetic force acts on superconductors.

Further, as a result of recent improvement in the characteristics of a high temperature bulk superconductor (particularly, a copper oxide superconductor) and recent trends for larger sizes thereof, the magnitude of a magnetic field that can be trapped in a bulk superconductor has increased by leaps and bounds. Such an increase in the magnitude of the magnetic field is accompanied by an increase in the electromagnetic force acting on the bulk superconductors, so that there has lately arisen a problem in that restriction is inevitably imposed on a trapped magnetic field depending on the strength of a bulk superconductor. Accordingly, for enhancement in performance of a bulk superconducting magnet utilizing a trapped magnetic field, it has become important to enhance the mechanical properties of the bulk superconductors rather than to further enhance the superconducting properties.

Accordingly, the inventor, et al. have previously proposed high-temperature bulk superconductors, having a considerably high mechanical strength, as follows:

a) an "oxide superconductor" (refer to JP, 3144675, B) comprising an oxide bulk superconductor produced by a melt process and having a resin-impregnated layer of an epoxy resin, and so forth (resin impregnated layer impregnated with resin through microcracks and voids unavoidably included therein in a process of producing an oxide bulk superconductor in the state of a pseudo single crystal in an atmosphere under a reduced pressure);

b) an "oxide superconductor" (refer to JP, 3144675, B) comprising an oxide bulk superconductor having a resin-impregnated layer and produced by a melt method, wherein the oxide bulk superconductor contains at most 40% by weight of Ag;

c) an "oxide superconductor" (refer to JP, 3100370, B) comprising an oxide bulk superconductor having a resin-impregnated layer and the outer surface thereof covered with a resin layer dispersedly incorporating a filler material of a small linear thermal expansion coefficient, such as quartz, calcium carbonate, alumina, alumina hydrate, glass, talc, calcined gypsum, and so forth, produced by a melt process;

d) an "oxide superconductor" (refer to JP, 3100375, B) comprising an oxide bulk superconductor having "an adhesively covering layer of resign-impregnated fabric" on the outer surface thereof and a resin-impregnated layer in a surface portion thereof, produced by a melt process; and so forth.

The above-described oxide superconductors (high-temperature bulk superconductors) with such a treatment of forming the resin-impregnated layer, applied thereto, have an excellent mechanical strength and consequently, have excellent characteristics in that they are capable of ensuring a high trapped magnetic field (high trapped magnetic field with the magnitude thereof enhanced to the extent in excess of 10 T in terms of magnetic flux density), which has not been seen before, and besides, deterioration of the trapped magnetic field is small, even after thermal cycles of cooling and warming, and electromagnetic hysteresis of electromagnetic force repeatedly applied thereto. As a result of further perusal thereof by the inventor, et al, however, it has become apparent that even those high-strength high-temperature bulk superconductors have the following problems.

More specifically, with a superconducting magnet made of the high-temperature bulk superconductor, there is normally adopted a magnetizing method of applying a magnetizing treatment to the high-temperature bulk superconductor placed in an external magnetic field higher than a trapped magnetic field aimed as a target while cooling the same with a gas evolved from liquid helium, and causing a magnetic field to be sufficiently trapped by gradually lowering the external magnetic field from the state described. In such a case, there will not occur a situation such that the high-temperature bulk superconductor reinforced by resin-impregnation, or the like is unable to withstand Lorentz force when an external magnetic field with a magnetic flux density in excess of 10 T is applied, as with the case of a conventional high-temperature bulk superconductor without reinforcement by resin-impregnation, or the like, thereby resulting in destruction. In the case of applying the external magnetic field with the magnetic flux density in excess of 10 T, as never experienced before, a phenomenon (quenching phenomenon) wherein a superconducting state is broken by generation of heat due to an avalanche-like movement of magnetic flux lines, called the flux jump, is prone to occur.

The higher a magnetic field becomes, the more often such a phenomenon, as observed when applying a magnetizing treatment to the high-temperature bulk superconductor, is prone to occur, and in the case of a magnetic field with a magnetic flux density in excess of 10 T, it has been found extremely difficult to magnetize even the high-temperature bulk superconductor with the reinforcing treatment applied thereto due to the above-described phenomenon.

That is, the inventors have found through experiments on the high-temperature bulk superconductor reinforced by resin-impregnation that in order to attain a higher trapped magnetic field in the high-temperature bulk superconductor, there is the need for avoiding adverse effects of generation of heat, due to the flux jump, in addition to the need for enhancement in mechanical strength of the high-temperature bulk superconductor.

SUMMARY OF THE INVENTION

It is therefore an object of the invention to provide a superconducting magnet made of a high-temperature-bulk superconductor, capable of trapping a high magnetic field with ease and stably, thereby contributing to a further enhancement in the performance of equipment and so forth with the superconducting magnet applied thereto.

Accordingly, in order to achieve the object described above, the inventor, et al. have conducted intensive studies and have succeeded in obtaining the following information.

The quenching phenomenon, occurring at the time of applying the magnetizing treatment to the high-temperature bulk superconductor, as described above, is attributable to "generation of heat" caused by electromotive voltage generated by rapid movement (the flux jump) of magnetic flux lines, passing through the high-temperature bulk superconductor, to the periphery thereof, and because of a low thermal conductivity of the high-temperature bulk superconductor, heat locally generated cannot be dissipated to the outside of the high-temperature bulk superconductor, so that accumulation of the heat causes the temperature of the bulk superconductor to rise locally, thereby resulting in quenching.

In contrast, if an artificial hole (either a through-hole or a bottomed hole) is bored at a suitable location of an oxide bulk superconductor, and the hole is brought into contact with a low melting metal (a low melting metal having a melting point not higher than from 200° C. to 300° C.) in molten state, the oxide bulk superconductor is impregnated with the low melting metal through microcracks and voids, existing in the surface of the oxide bulk superconductor and in the interior thereof (in spite of the tendency of impregnation with the low melting metal being considered unlikely to occur, it is in fact difficult to prevent presence of the microcracks and voids inside the oxide bulk superconductor in the production process thereof, so that impregnation of the low melting metal into the oxide bulk superconductor is accomplished through the microcracks and voids by a vacuum drawing treatment and so forth) and at the same time, the artificial hole in a state of being linked with layers impregnated with the low melting metal is filled with the low melting metal.

With the oxide bulk superconductor impregnated with, and filled with the low melting metal, even if there occurs local generation of heat due to the flux jump at the time of applying the magnetizing treatment thereto, the heat rapidly propagates to the artificial hole impregnated with, and filled with the low melting metal through the layers impregnated with the low melting metal having an excellent thermal conductivity because it is metal, so that there emerges no spot where extreme rise in temperature occurs, thereby blocking the occurrence of quenching.

In addition, with the oxide bulk superconductor impregnated with, and filled with the low melting metal, the mechanical strength thereof is enhanced and a tendency of cracking can be largely reduced.

In this case, by embedding a heat conducting metal material such as, an aluminum wire with the low melting metal filled in, and solidified in the artificial hole, the heat generated inside the oxide bulk superconductor can be released to the outside more rapidly, so that it becomes possible to cause the oxide bulk superconductor to trap a high magnetic field by a magnetizing process relatively short in processing time.

The invention has been developed based on the above-described information and findings, and provides a superconducting magnet made of a high-temperature bulk superconductor, and a process of producing the same, as shown under the following items (1) through (4).

(1) A superconducting magnet made of a high-temperature bulk superconductor, for use by trapping a magnetic field, wherein the high-temperature bulk superconductor is provided with an artificial hole, at least the artificial hole is impregnated with, and filled with a low melting metal, and a heat conducting metal material is embedded with portions of the high-temperature bulk superconductor, impregnated with, and filled with the low melting metal.

(2) A superconducting magnet made of a high-temperature bulk superconductor as set forth under item (1) above, wherein the heat conducting metal material is made of an element selected from the group consisting of Al, Cu, Ag, and Au.

(3) A process of producing a superconducting magnet made of a high-temperature bulk superconductor, comprising the steps of providing an artificial hole in the high-temperature bulk superconductor, applying a process of disposing a heat conducting metal material in at least portions of the high-temperature bulk superconductor where bonding of the heat conducting metal material with a low melting metal to be impregnated in, and filling up at least the artificial hole is to be made before impregnating and filling up at least the artificial hole with the low melting metal, and executing a process of magnetizing the high-temperature bulk superconductor to which the heat conducting metal material is embedded through the intermediary of the low melting metal after being solidified.

(4) A process of producing a superconducting magnet made of a high-temperature bulk superconductor as set forth under item (3) above, wherein the process of magnetizing is executed with an external magnetic field maintaining a magnetic flux density not less than 10 T.

PREFERRED EMBODIMENTS OF THE INVENTION

Now, any kind selected from among the known oxide bulk superconductors may be used as an oxide bulk superconductor applicable to the present invention, but it can be said that an RE—Ba—Cu—O based copper oxide bulk superconductor (RE refers to at least one rare earth element selected from the group consisting of Y, La, Nd, Sm, Eu, Gd, Dy, Ho, Er, Tm, and Yb) known as a high-temperature oxide superconducting material having a high trapped magnetic field is preferably used for the purpose.

Particularly, more preferable for use as the oxide bulk superconductor is an oxide superconducting material comprising an $REBa_2Cu_3O_y$ phase (RE refers to at least one rare earth element selected from the group consisting of Y, Dy, Ho, Er, Tm, and Yb) known as a material having a high trapped magnetic field as a parent phase, and an $RE_2BaCuO_5$ phase (RE refers to at least one rare earth element selected from the group consisting of Y, Sm, Eu, Gd, Dy, Ho, Er, Tm, and Yb) as a dispersion phase, in an amount of at most 50% by volume of the parent phase, and an oxide superconducting material comprising an $RE_{1+x}Ba_{2-x}Cu_3O_y$ phase (RE refers to at least one rare earth element selected from the group consisting of La, Nd, Sm, Eu, and Gd, and preferably, with $-0.1<x<0.2$, and $6.5<y<7.2$) as a parent phase, and an $RE_{4-2x}Ba_{2+2x}Cu_{2-x}O_{10-2x}$ phase (RE refers to at least one rare earth element selected from the group consisting of La, and Nd, and preferably, with $-0.2<x<0.3$) or an $RE_2BaCuO_5$ phase (RE refers to at least one rare earth element selected from the group consisting of Sm, Eu, and Gd) as a dispersion phase, in an amount of at most 50% by volume of the parent phase.

It can be said that "the oxide superconductor having the resin-impregnated layer" disclosed in JP, 3144675, B, "the oxide superconductor having the resin-impregnated layer, and the outer surface thereof, covered with a resin layer dispersedly incorporating a filler material of a small linear thermal expansion coefficient", disclosed in JP, 3100370, B), "the oxide superconductor having the adhesively covering layer of the resin-impregnated fabric on the outer surface thereof or "the oxide superconductor having the resin-impregnated layer in the surface portion thereof and the outer surface thereof covered with the adhesive covering layer of the resign-impregnated fabric", as disclosed in refer to JP, 3100375, B is preferably used for the oxide bulk superconductor described above.

The position and number of artificial holes to be provided in a high-temperature bulk superconductor may be decided upon as appropriate, but it is normally sufficient to provide one hole in the central part thereof.

The artificial hole may be either a through-hole or a bottomed hole, and means of forming the artificial hole are not to be particularly specified, however, making a hole by a drill is considered as the easiest and preferable means.

Because the oxide bulk superconductor causes bound oxygen to be dissipated when heated above a certain temperature, failing to exhibit superconductivity, there is the need for employing a metal or an alloy, having a melting point lower than "a temperature causing the dissipation of oxygen", as a low melting metal to be impregnated in, and filling up the artificial hole.

Further, "the temperature causing the dissipation of oxygen" is on the order of about 300° C. in the case of a Y—Ba—Cu—O based bulk superconductor, on the order of about 250° C. in the case of a Gd—Ba—Cu—O based bulk superconductor, and on the order of about 200° C. in the case of an Sm—Ba—CU—O based bulk superconductor or Nd—Ba—Cu—O based bulk superconductor. Accordingly, any low melting metal having a melting point not higher than 200° C. can be applied to any kind of the oxide bulk superconductor.

In this connection, there are shown hereunder specific examples of the low melting metals applicable to the invention and respective melting temperatures thereof.

(a) 44.7 wt. % Bi—22.6 wt. % Pb—8.3 wt. % Sn—5.3 wt. % Cd—19.1 wt. % In alloy (melting temperature: 46.7° C.)
(b) 42.34 wt. % Bi—22.86 wt. % Pb—11.0 wt. % Sn—8.46 wt. % Cd—15.34 wt. % In alloy (melting temperature: 47.0° C.)
(c) 49.4 wt. % Bi—18.0 wt. % Pb—11.6 wt. % Sn—21.0 wt. % In alloy (melting temperature: 58.0° C.)
(d) 48.0 wt. % Bi—25.6 wt. % Pb—12.8 wt. % Sn—9.6 wt. % Cd—4.0 wt. % In alloy (melting temperature: 61.0° C.)
(e) 50.0 wt. % Bi—25.0 wt. % Pb—12.5 wt. % Sn—12.5 wt. % Cd alloy (melting temperature: 60.0° C.)
(f) 50.0 wt. % Bi—26.7 wt. % Pb—13.3 wt. % Sn—10.0 wt. % Cd alloy (melting temperature: 70.0° C.)
(g) 40.0 wt. % Bi—40.0 wt. % Pb—11.5 wt. % Sn—10.0 wt. % Cd alloy (melting temperature: 70.0° C.)
(h) 57.0 wt. % Bi—17.0 wt. % Sn—26.0 wt. % In alloy (melting temperature: 78.8° C.)
(i) 51.65 wt. % Bi—40.2 wt. % Pb—8.15 wt. % Cd alloy (melting temperature: 91.5° C.)
(j) 52.5 wt. % Bi—32.0 wt. % Pb—15.5 wt. % Sn alloy (melting temperature: 95.0° C.)
(k) 52.5 wt. % Bi—32.0 wt. % Pb—15.5 wt. % Sn alloy (melting temperature: 95.0° C.)
(l) 50.0 wt. % Bi—28.0 wt. % Pb—22.0 wt. % Sn alloy (melting temperature: 100° C.)
(m) 53.9 wt. % Bi—25.9 wt. % Sn—20.2 wt. % Cd alloy (melting temperature: 102.5° C.)
(n) 55.5 wt. % Bi—44.5 wt. % Pb alloy (melting temperature: 124° C.)
(o) 58.0 wt. % Bi—42.0 wt. % Sn alloy (melting temperature: 138° C.)
(p) 40.0 wt. % Bi—60.0 wt. % Sn alloy (melting temperature: 138° C.)
(q) 50.0 wt % Bi—27.5 wt % Pb—13.5 wt. % Sn—9.0 wt. % Sb alloy (melting temperature: 148° C.)
(r) Bi (melting temperature: 271.3° C.)
(s) In (melting temperature: 156.2° C.)
(t) Sn (melting temperature: 231.9° C.)

It can be said that wire made of any element selected from the group consisting of Al, Cu, Ag, Au, and so forth, having a high thermal conductivity, is preferably used for a heat conducting metal material for allowing heat to escape from a portion of the low melting metal, impregnated in, and filling up the artificial hole, to the outside, but the heat conducting metal material is not particularly limited thereto, so that any metal material having an excellent thermal conductivity may be used. For example, when impregnating and filling up the artificial hole with a low melting metal in a molten state, the low melting metal may be caused to form a covering layer so as to cover the surface of the high-temperature bulk superconductor, enabling the covering layer of the low melting metal to play also a role of the heat conducting metal material.

A method of bringing at least a region of the artificial hole of the oxide bulk superconductor kept in an atmosphere under reduced pressure, such as in a vacuum, into contact with the low melting metal in molten liquid state is preferable as a process for impregnating and filling up the artificial hole of the oxide bulk superconductor with the low melting metal, however, other methods, such as "a pressure impregnation method" and so forth, may also be used without any problems.

In this connection, it is preferable to carry out in this stage of processing the impregnation of the low melting metal not only into the region of the artificial hole but also from the entire surface of the oxide bulk superconductor.

Upon bringing the oxide bulk superconductor into contact with the low melting metal in a molten state in an atmosphere under reduced pressure or in a pressurized atmosphere, portions of the low melting metal permeate into the oxide bulk superconductor through microcracks and voids, having respective openings in the surface of the oxide bulk superconductor (including the inner surface of the artificial hole), fill up the microcracks and voids, existing inside the oxide bulk superconductor (particularly, in the surface portion thereof), and those portions of the low melting metal are united with a portion of the low melting metal, filling up the artificial hole, to be thereby strongly bonded with the oxide bulk superconductor. Accordingly, local heat generated at the time of magnetizing is rapidly dissipated to the portion of the low melting metal filling the artificial hole, through the portions of the low melting metal impregnated into the oxide bulk superconductor.

In this connection, it is to be pointed out that impregnation of the low melting metal will not occur by a process of simply bringing the oxide bulk superconductor into contact with the low melting metal in a molten state instead of the process of impregnation in an atmosphere under a reduced pressure or the process of pressure impregnation, and solidified portions of the low melting metal will not satisfactorily bond with the oxide bulk superconductor, thereby failing to exhibit desired effects of heat dissipation.

There is no limitation on the means for bonding the portion of the low melting metal, impregnated in, and filling up the artificial hole, with the heat conducting metal material as long as smooth heat conduction is attained, however, it is preferable to employ a method of inserting the heat conducting metal material, such as an aluminum wire, in the artificial hole provided in the high-temperature bulk superconductor so as to be disposed therein before applying a process of impregnation with the low melting metal when impregnating and filling up the artificial hole with the low melting metal, and solidifying the portion of the low melting metal, in the artificial hole, so as to be integral with the heat conducting metal material.

Figure 1:
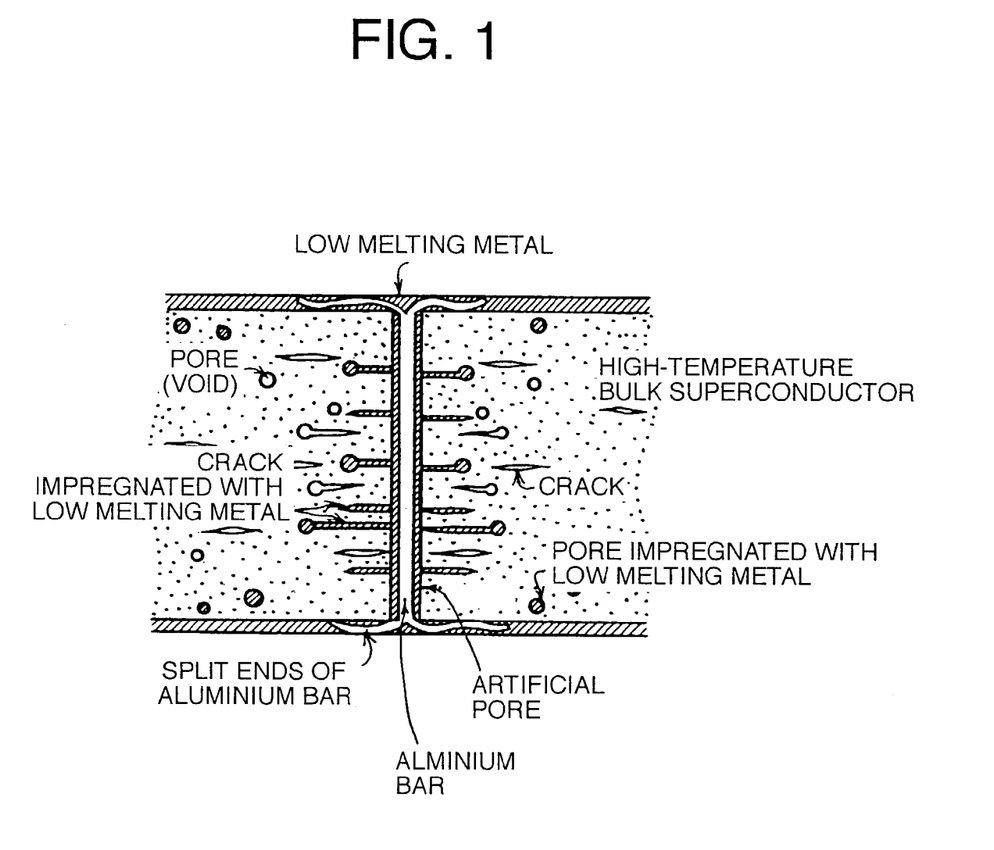
FIG. 1 is a schematic sectional view of an embodiment of a superconducting magnet made of a high-temperature bulk superconductor according to the invention.

FIG. 1 is a schematic sectional view of an embodiment of a superconducting magnet made of a high-temperature bulk superconductor according to the invention.

The superconducting magnet made of the high-temperature bulk superconductor is obtained by boring an artificial through-hole in the high-temperature bulk superconductor formed in the shape of a disk, inserting a heat conducting metal wire (an aluminum wire) with both ends split in the shape resembling the arms of an octopus into the artificial through-hole, and subsequently applying the process of impregnation with the low melting metal to the high-temperature bulk superconductor in whole, including the artificial through-hole.

As shown in FIG. 1, because there exist numerous microcracks and voids in the high-temperature bulk superconductor formed as above, if the process of impregnation with the low melting metal is applied in an atmosphere under reduced pressure, and so forth, the low melting metal is impregnated into the microcracks and voids while filling up the artificial through-hole and fully covering the surface of the high-temperature bulk superconductor, thereby being bonded and united with the heat conducting metal wire before solidification.

Accordingly, local heat generated at the time of magnetizing rapidly propagates to the portion of the low melting metal, filling up the artificial hole, through the portions of the low melting metal impregnated, and is transferred to a covering layer of the low melting metal, covering the surfaces of the high-temperature bulk superconductor, to be thereby diverted to the outside. Hence, occurrence of a phenomenon leading to quenching due to a rise in temperature at localized parts of the high-temperature bulk superconductor can be effectively blocked.

FIG. 1 shows an example of the superconducting magnet made of the high-temperature bulk superconductor, wherein both ends of the heat conducting metal wire are bonded with the covering layer of the low melting metal, covering the surfaces of the high-temperature bulk superconductor, respectively, however, both the ends of the heat conducting metal wire may obviously be bonded with other heat dissipating members.

For a process of magnetizing a superconducting magnet made of the high-temperature bulk superconductor, it is preferable to adopt the public known means, that is, the magnetizing method of applying a high external magnetic field in a gas evolved from liquid helium to thereby trap a magnetic field, however, it can be said that by applying a magnetizing process with the external magnetic field having a magnetic flux density in excess of 10 T, the invention will have more pronounced advantageous effects.

Further, it goes without saying that either "a static magnetic field method" or "a pulse method" may be adopted as a magnetizing method.

Now, the invention is described in more detail with reference to working examples.

EXAMPLE 1

Bulk materials comprising a $YBa_2Cu_3O_y$ superconductor, and a $Y_2BaCuO_5$ phase dispersed therein, in an amount of 0, 10, 20, 30, and 40% by volume were prepared by a melt process.

$MYBa_2Cu_3O_y$ material with an $SmBa_2Cu_3O_y$ cyrstal as a seed crystal was cooled down to 1050° C. in 30 minutes after heating at 1100° C. for 20 minutes, and subsequently, was further cooled down to 900° C. at a cooling rate of 0.5° C./h.

After crystal growth, oxygen annealing was applied thereto in an oxygen flow at 400° C. under one atmospheric pressure for 250 hours.

Next, respective bulk superconductors were placed in a vacuum container, and were permeated with resin by the following method of resin impregnation.

That is, in a preprocess stage, the respective bulk superconductors were immersed in a silane based coupling agent {R' Si (OR)$_3$: R' is an organic functional group, and OR is an inorganic functional group}, and were put in a vacuum tank so as to be in a condition of reduced pressure at $6.7 \times 10^{-2}$ Pa, subsequently, reverting to a condition under atmospheric pressure. Then, the respective bulk superconductors were put in a drying furnace to be dried.

Subsequently, bisphenol A epoxy resin, an aromatic polyamine, and a silane based coupling agent, in a condition preheated up to 30° C., respectively, were mixed at a blending composition (weight ratio) of 100:32:1, and were deaerated in a vacuum. Thereafter, the respective bulk superconductors were preheated up to 70° C., and were put in a vacuum tank where the pressure was reduced to $6.7 \times 10^{-2}$ Pa. Subsequently, the resin was poured in such a way as to cover the respective bulk superconductors, the pressure was increased up to 0.4 MPa, and heating was applied thereto below 80° C. for 6 hours and below 120° C. for 2 hours, thereby curing the resin.

An artificial through-hole (1 mm in diameter) was bored in the respective bulk superconductors, impregnated with the epoxy resin, using a drill. The through-hole was provided in the central part of the respective bulk superconductors, in the direction of the c-axis thereof.

Subsequently, the same treatment with the silane based coupling agent as described above was applied thereto, an aluminum bar (a soft wire-like bar 0.9 mm in diameter) was inserted into the artificial through-hole as bored, and an end of the aluminum bar, protruding into a bottom part of the respective bulk superconductors (on the side where the seed crystal did not exist) was split into two parts to be brought into intimate contact with the bottom surface of the respective bulk superconductors.

The respective bulk superconductors were preheated up to 150° C., a liquid metal having a chemical composition of 53.9% Bi—25.9. % Sn—20.2% Cd also at 150° C. was poured so as to accumulate at the bottom of the respective bulk superconductors, and pressure was reduced to $6.7 \times 10^{-2}$ Pa in the vacuum tank to be subsequently increased up to 0.4 MPa. Thereafter, the temperature was lowered down to normal temperature (20° C.), thereby solidifying the liquid metal.

Subsequently, the respective bulk superconductors with carbon fiber wound around the circumferential side face thereof were impregnated with resin by the same method as described above.

Next, the respective bulk superconductors were cooled down to 100K, a magnetic field with a magnetic flux density of 13 T was applied thereto, the respective bulk superconductors were further cooled down to 50K, and subsequently, a magnetic field on the respective surfaces of the bulk superconductors was measured by use of a Hall sensor device while lowering the magnetic field from 13 T.

As a result, the specimens having a content of Y211 phase at 0, 10, 20, 30, and 40%, trapped magnetic flux densities of 5 T, 7 T, 6.5 T, 6 T, and 6 T, respectively.

On the other hand, when the same measurements as described above were conducted on specimens wherein vacuum treatment with a low melting metal was not applied after providing an artificial hole, it was found that after the temperature of the bulk superconductors rose up to 55K in the course of lowering a magnetic field, there was a sudden increase in temperature up to 70K. It was confirmed that the trapped magnetic fields showed magnetic flux density values close to 0 T.

As described in the foregoing, with all the specimens in which treatment of impregnation with the low melting metal was applied after providing the artificial hole, relatively large trapped magnetic fields were obtained as compared with the specimens to which such treatment was not applied.

Further, it was found by post-test observation with a microscope that the interior of the artificial hole was filled with the low melting metal and internal microcracks in the vicinity of the artificial hole were also filled with the low melting metal.

EXAMPLE 2

Respective bulk materials comprising an $Sm_{0.9}Ba_{2.1}Cu_3O_y$ oxide superconductor having an $Sm_2BaCuO_5$, phase (Sm211 phase) dispersed therein, in an amount of 30, and 40% by volume, respectively, were prepared by the melt process. Melting conditions were adopted such that the $Sm_{0.9}Ba_{2.1}Cu_3O_y$ material was cooled down to 1050° C. in 20 minutes after heating at 1200° C. for 20 minutes in an atmosphere of a mixed gas of oxygen and argon with an oxygen partial pressure maintained at 1%, and subsequently, was further cooled down to 900° C. at a cooling rate of 0.5° C./h after placing an $NdBa_2Cu_3O_y$, crystal on top as a seed crystal.

With respect to specimens containing 0%, and 10% of the Sm211 phase, respectively, in a post-growth stage, large cracks were observed. Further, even with specimens containing 20% of the Sm211 phase, microcracks were observed although not observed by the naked eye.

Thereafter, oxygen annealing was applied to respective bulk superconductors containing 30%, and 40% of the Sm211 phase without any cracks being observed, in an oxygen flow at 350° C. under one atmospheric pressure for 200 hours.

Next, the respective bulk superconductors were placed in a vacuum container, and the respective bulk superconductors were permeated with resin by the following method of resin impregnation.

That is, in a preprocess stage, the respective bulk superconductors were immersed in a silane based coupling agent {R' Si (OR)$_3$: R' is an organic functional group, and OR is an inorganic functional group}, and were put in a vacuum tank so as to be in a condition of a reduced pressure at $6.7 \times 10^{-2}$ Pa, subsequently, reverting to a condition under atmospheric pressure. Then, the respective bulk superconductors were put in a drying furnace to be dried.

Subsequently, bisphenol A epoxy resin, an aromatic polyamine, and a silane based coupling agent, in a condition preheated up to 30° C., respectively, were mixed at a blending composition (weight ratio) of 100:32:1. Thereafter, the respective bulk superconductors were preheated up to 70° C., the resin was poured in such a way as to cover the respective bulk superconductors, and the respective bulk superconductors were put in the vacuum tank where the pressure was reduced to $6.7 \times 10^{-2}$ Pa to be then deaerated.

After sufficiently eliminating the pores, the pressure was increased up to 0.3 MPa, and heating was applied thereto below 80° C. for 6 hours and below 120° C. for 2 hours, thereby curing the resin.

An artificial through-hole (1 mm in diameter) was bored in the respective bulk superconductors, impregnated with the epoxy resin, using a drill. The through-hole was provided in the central part of the respective bulk superconductors, in the direction of the c-axis thereof.

Subsequently, with the same treatment with the silane based coupling agent as described above applied thereto, an aluminum bar (a soft wire-like bar 0.9 mm in diameter) was inserted into the artificial through-hole as bored, and an end of the aluminum bar, protruding into a bottom part of the respective bulk superconductors (on the side where the seed crystal did not exist) was split into two parts to be brought into intimate contact with the bottom surface of the respective bulk superconductors.

The respective bulk superconductors were preheated up to 150° C., a liquid metal having a chemical composition of 53.9% Bi—25.9. % Sn—20.2% Cd at 120° C. was poured so as to accumulate at the bottom of the respective bulk superconductors, and the pressure was reduced to $6.7 \times 10^{-2}$ Pa in the vacuum tank to be subsequently increased up to 0.4 MPa. Thereafter, the temperature was lowered down to normal temperature (20° C.), thereby solidifying the liquid metal.

Subsequently, the respective bulk superconductors with carbon fiber wound around the circumferential side face thereof were impregnated with resin by the same method as described above.

Next, the respective bulk superconductors were cooled down to 100K, a magnetic field with a magnetic flux density at 13 T was applied thereto, the respective bulk superconductors were further cooled down to 50K, and subsequently, a magnetic field on the respective surfaces of the bulk superconductors was measured by use of the Hall sensor device while lowering the magnetic field from 13 T.

As a result, the specimens having a content of the Sm211 phase at 30%, and 40% trapped magnetic flux densities at a high value of 10 T, and 8 T, respectively.

On the other hand, when the same measurements as described above were conducted on specimens in which vacuum treatment with a low melting metal was not applied after providing an artificial hole, it was found that after the temperature of bulk superconductors rose up to 55K in the course of lowering a magnetic field, there was a sudden increase in temperature up to 90K. It was confirmed that the trapped magnetic fields showed magnetic flux density values close to 0 T.

As described in the foregoing, with all the specimens wherein impregnation with the low melting metal was applied after providing the artificial hole, relatively large trapped magnetic fields were obtained as compared with the specimens to which such treatment was not applied.

Further, it was found by post-test observation with a microscope that the interior of the artificial hole was filled with the low melting metal and internal microcracks in the vicinity of the artificial hole were also filled with the low melting metal.

EXAMPLE 3

Respective bulk materials comprising an $Nd_{0.9}Ba_{2.1}Cu_3O_y$ oxide superconductor, and an $Nd_{3.6}Ba_{2.4}Cu_{1.8}O_z$, phase (Nd422 phase) dispersed therein, in an amount of 0, 10, 20, 30, and 40% by volume, were prepared by the melt process.

Melting conditions were adopted such that $Nd_{0.9}Ba_{2.1}Cu_3O_y$, material (with an MgO single crystal on top as a seed crystal) was cooled down to 1010° C. in 20 minutes after heating at 1040° C. for 20 minutes in "an atmosphere of a mixed gas of oxygen and argon with an oxygen partial pressure maintained at 0.1%", and subsequently, was further cooled down to 900° C. at a cooling rate of 0.5° C./h.

With respect to specimens containing 0%, and 10% of the Nd422 phase, in a post-growth stage, large cracks were observed.

Thereafter, oxygen annealing was applied to respective bulk superconductors containing 20%, 30%, and 40% of the Nd422 phase, in an oxygen flow at 300° C. under one atmospheric pressure for 300 hours. No cracks were observed for these specimens.

Next, the respective bulk superconductors were placed in a vacuum container, and the respective bulk superconductors were permeated with resin by the following method of resin impregnation.

That is, in a preprocess stage, the respective bulk superconductors were immersed in a silane based coupling agent {R' Si (OR)$_3$: R' is an organic functional group, and OR is an inorganic functional group}, and were put in a vacuum tank so as to be in a condition of a reduced pressure at $6.7 \times 10^{-2}$ Pa, subsequently, reverting to a condition under atmospheric pressure. Then, the respective bulk superconductors were put in a drying furnace to be dried.

Subsequently, bisphenol A epoxy resin, an aromatic polyamine, and a silane based coupling agent, in a condition preheated up to 30° C., respectively, were mixed at a blending composition (weight ratio) of 100:32:1, and were deaerated in a vacuum. Thereafter, the respective bulk superconductors were preheated up to 70° C., and were put in the vacuum tank where the pressure was reduced to $6.7 \times 10^{-2}$ Pa. Subsequently, the resin was poured in such a way as to cover the respective bulk superconductors, the pressure was increased up to 0.2 MPa, and thereafter, heating was applied thereto below 80° C. for 6 hours and below 120° C. for 2 hours, thereby curing the resin.

An artificial through-hole (1 mm in diameter) was bored in the respective bulk superconductors impregnated with the epoxy resin, using a drill. The through-hole was provided in the central part of the respective bulk superconductors, in the direction of the c-axis thereof.

Subsequently, the same treatment with the silane based coupling agent as described above was applied thereto, an aluminum bar (a soft wire-like bar 0.9 mm in diameter) was inserted into the artificial through-hole as bored, and an end of the aluminum bar, protruding into a bottom part of the respective bulk superconductors (on the side where the seed crystal did not exist), was split into two parts to be brought into intimate contact with the bottom surface of the respective bulk superconductors.

The respective bulk superconductors were preheated up to 150° C., a liquid metal having chemical composition of 53.9% Bi—25.9% Sn—20.2% Cd at 120° C. was poured so as to accumulate at the bottom of the respective bulk superconductors, and the pressure was reduced to $6.7 \times 10^{-2}$ Pa in the vacuum tank to be subsequently increased up to 0.3 MPa. Thereafter, the temperature was lowered down to normal temperature (20° C.), thereby solidifying the liquid metal.

Subsequently, the respective bulk superconductors with carbon fiber wound around the circumferential side face thereof were impregnated with resin by the same method as described above.

Next, the respective bulk superconductors were cooled down to 100K, a magnetic field with a magnetic flux density at 13 T was applied thereto, the respective bulk superconductors were further cooled down to 50K, and subsequently, a magnetic field on the respective surfaces of the bulk superconductors was measured by use of the Hall sensor device while lowering the magnetic field from 13 T.

As a result, the specimens having a content of the Nd422 phase at 20%, 30%, and 40%, trapped magnetic flux densities at a high value of 8 T, 11 T, and 8 T, respectively.

On the other hand, when the same measurements as described above were conducted on specimens wherein vacuum treatment with a low melting metal was not applied after providing an artificial hole, it was found that after the temperature of the bulk superconductors rose up to 55K in the course of lowering a magnetic field, there was a sudden increase in temperature up to 70K. It was confirmed that the trapped magnetic fields showed magnetic flux density values close to 0 T.

As described in the foregoing, with all the specimens in which impregnation with the low melting metal was applied after providing the artificial hole, relatively large trapped magnetic fields were obtained as compared with the specimens to which such treatment was not applied.

Further, it was found by post-test observation with an optical microscope that the interior of the artificial hole was filled with the low melting metal and internal microcracks in the vicinity of the artificial hole were also filled with the low melting metal.

EXAMPLE 4

Respective bulk materials comprising a $YBa_2Cu_3O_y$, superconductor, and a $Y_2BaCuO_5$, phase dispersed therein, in an amount of 0, 10, 20, 30, and 40% by volume, respectively, with the addition of 10% by weight of Ag, were prepared by the melt process.

Melting conditions were adopted such that $YBa_2Cu_3O_y$, material with a $YBa_2Cu_3O_y$, crystal on top as a seed crystal was cooled down to 1000° C. in 30 minutes after heating at 1050° C. for 20 minutes, and subsequently, was further cooled down to 900° C. at a cooling rate of 0.5° C./h.

Thereafter, oxygen annealing was applied thereto in an oxygen flow at 400° C. under one atmospheric pressure for 250 hours.

Next, respective bulk superconductors were placed in a vacuum container, and the respective bulk superconductors were permeated with resin by the following method of resin impregnation.

That is, first, in a preprocess stage, the respective bulk superconductors were immersed in a silane based coupling agent {R' Si (OR)$_3$: R' is an organic functional group, and OR is an inorganic functional group}, and were placed in a vacuum tank so as to be in a condition of reduced pressure at $6.7 \times 10^{-2}$ Pa, subsequently, reverting to a condition under atmospheric pressure. Then, the respective bulk superconductors were put in a drying furnace to be dried.

Subsequently, bisphenol A epoxy resin, an aromatic polyamine, and a silane based coupling agent, in a condition preheated up to 30° C., were mixed at a blending composition (weight ratio) of 100:32:1. Thereafter, the respective bulk superconductors were preheated up to 70° C., the resin was poured in such a way as to cover the respective bulk superconductors, and the respective bulk superconductors were put in the vacuum tank where pressure was reduced to $6.7 \times 10^{-2}$ Pa to be then deaerated. After sufficiently eliminating pores, the pressure was increased up to 0.2 MPa, and heating was applied thereto below 80° C. for 6 hours and below 120° C. for 2 hours, thereby curing the resin.

An artificial through-hole (1 mm in diameter) was bored in the bulk superconductors, impregnated with the epoxy resin, using a drill. The through-hole was provided in the central part of the respective bulk superconductors, in the direction of the c-axis thereof.

Subsequently, the same treatment with the silane based coupling agent as described above was applied thereto, an aluminum bar (a soft wire-like bar 0.9 mm in diameter) inserted into the artificial through-hole as bored, and an end of the aluminum bar, protruding into a bottom part of the respective bulk superconductors (on the side where the seed crystal was not on) split into two parts to be brought into intimate contact with the bottom surface of the respective bulk superconductors.

The respective bulk superconductors were preheated up to 150° C., a liquid metal having a chemical composition of 57% Bi—17% Sn—26% In at 100° C. was poured so as to accumulate at the bottom of the respective bulk superconductors, and the pressure was reduced to $6.7 \times 10^{-2}$ Pa in the vacuum tank to be subsequently increased up to 0.3 MPa. Thereafter, the temperature was lowered down to normal temperature (20° C.), thereby solidifying the liquid metal.

Subsequently, the respective bulk superconductors with carbon fiber wound around the circumferential side face thereof were impregnated with resin by the same method as described above.

Next, the respective bulk superconductors were cooled down to 100K, a magnetic field with a magnetic flux density at 16 T was applied thereto, the respective bulk superconductors were further cooled down to 30K, and subsequently, a magnetic field on the respective surfaces of the bulk superconductors was measured by use of the Hall sensor device while lowering the magnetic field from 16 T.

As a result, the specimens having a content of a Y211 phase at 0, 10, 20, 30, and 40%, trapped magnetic flux densities of 11 T, 12 T, 12 T, 15 T, and 13 T, respectively.

On the other hand, when the same measurements as described above were conducted on specimens wherein vacuum treatment with a low melting metal was not applied after providing the artificial hole, it was found that after the temperature of bulk superconductors rose up to 55K in the course of lowering the magnetic field, there was a sudden increase in temperature up to 70K. It was confirmed that the trapped magnetic fields showed magnetic flux density values close to 0 T.

As described in the foregoing, with all the specimens wherein treatment of impregnation with the low melting metal was applied after providing the artificial hole, relatively large trapped magnetic fields were obtained as compared with the specimens to which such treatment was not applied.

Further, it was found by post-test observation with a microscope that the space between the aluminum bar and the respective bulk superconductors, inside the artificial hole, was filled with the low melting metal and internal microcracks in the vicinity of the artificial hole were also filled with the low melting metal.

EXAMPLE 5

Specimens of respective bulk materials comprising an $Sm_{0.9}Ba_{2.1}Cu_3O_y$ oxide superconductor, and an $Sm_2BaCuO_5$ phase (Sm211 phase) dispersed therein, in an amount of 0, 10, 20, 30, and 40% by volume, respectively, with 15% by weight of Ag, added thereto, were prepared by the melt process.

Melting conditions were adopted such that $Sm_{0.9}Ba_{2.1}Cu_3O_y$ material with an $SmBa_2Cu_3O_y$ phase therein as a seed crystal was cooled down to 990° C. in 20 minutes after heating at 1010° C. for 20 minutes in "an atmosphere of a mixed gas of oxygen and argon with an oxygen partial pressure maintained at 1%", and subsequently, was further cooled down to 850° C. at a cooling rate of 0.5° C./h.

In the specimens without Sm 211, in a post-growth stage, microcracks were observed although not by the naked eye.

Thereafter, oxygen annealing was applied to respective bulk superconductors containing 10%, 20%, 30%, and 40% of the Sm211 phase, without any cracks being observed, in an oxygen flow at 350° C. under one atmosphere pressure for 200 hours.

Next, the respective bulk superconductors were placed in a vacuum container, and were permeated with resin by the following method of resin impregnation.

That is, in a preprocess stage, the respective bulk superconductors were immersed in a silane based coupling agent {R' Si (OR)$_3$: R' is an organic functional group, and OR is an inorganic functional group}, and were put in a vacuum tank so as to be in a condition of a reduced pressure at $6.7 \times 10^{-2}$ Pa, subsequently, reverting to a condition under atmospheric pressure. Then, the respective bulk superconductors were put in a drying furnace to be dried.

Subsequently, bisphenol A epoxy resin, an aromatic polyamine, and a silane based coupling agent, in a condition preheated up to 30° C., respectively, were mixed at a blending composition (weight ratio) of 100:32:1. Thereafter, the respective bulk superconductors were preheated up to 70° C., the resin was poured in such a way as to cover the respective bulk superconductors, and the respective bulk superconductors were put in the vacuum tank where the pressure was reduced to $6.7 \times 10^{-2}$ Pa to be then deaerated. After sufficiently eliminating pores, heating was applied thereto below 80° C. for 6 hours and below 120° C. for 2 hours, thereby curing the resin.

Artificial through-holes (0.8 mm in diameter) were bored in the respective bulk superconductors and impregnated with the epoxy resin, using a drill. The through-hole was provided at three spots located between the center of the respective bulk superconductors, in the direction of the c-axis thereof, and the periphery thereof.

Subsequently, an aluminum bar (a soft wire-like bar 0.7 mm in diameter) was inserted into the respective artificial through-holes as bored, and respective ends of the aluminum bars were kept in such a condition as exposed to the outside.

The respective bulk superconductors were preheated up to 100° C., a liquid metal having chemical composition of 40% Bi—40% Pb—11.5% Sn—8.5% Cd also at 100° C. was poured so as to accumulate at the bottom of the respective bulk superconductors, and the pressure was reduced to $6.7 \times 10^{-2}$ Pa in the vacuum tank to be subsequently increased up to 0.3 MPa. Thereafter, the temperature was lowered down to normal temperature (20° C.), thereby solidifying the liquid metal.

Subsequently, the respective bulk superconductors with carbon fiber wound around the circumferential side face thereof were impregnated with resin by the same method as described above.

Next, the respective bulk superconductors were cooled down to 100K, a magnetic field with a magnetic flux density at 16 T was applied thereto, the respective bulk superconductors were further cooled down to 30K, and subsequently, a magnetic field on the respective surfaces of the bulk superconductors was measured by use of the temperature of the respective bulk superconductors and the Hall sensor device while lowering the magnetic field from 16 T.

As a result, the specimens having a content of the Sm211 phase at 10%, 20%, 30%, and 40%, trapped magnetic flux densities of 10 T, 13 T, 13 T and 10 T, respectively.

On the other hand, when the same measurements as described above were conducted on specimens in which vacuum treatment with a low melting metal was not applied after providing artificial holes, it was found that the trapped magnetic fields of the specimens having a Sm211 phase content of 10%, 20%, 30%, and 40%, had magnetic flux densities of 1 T, 1 T, 0.5 T and 0.5 T, respectively.

As described in the foregoing, with all the specimens wherein the treatment of impregnation with the low melting metal was applied after providing the artificial holes and installing the aluminum bar therein, relatively large trapped magnetic fields were obtained as compared with the specimens to which such treatment was not applied.

Further, it was found by post-test observation with a microscope that the space between the aluminum bar and the respective bulk superconductors, inside the respective artificial holes, was filled with the low melting metal and internal microcracks in the vicinity of the respective artificial holes were also filled with the low melting metal.

EXAMPLE 6

Specimens of bulk materials comprising a $YBa_2Cu_3O_y$ superconductor, and a $Y_2BaCuO_5$, phase dispersed therein, in an amount of 0, 10, 20, 30, and 40% by volume, with 10% by weight of Ag, added thereto, were prepared by the melt process.

Melting conditions were adopted such that $YBa_2Cu_3O_y$ material was cooled down to 1000° C. in 30 minutes after heating at 1050° C. for 20 minutes, and subsequently, was further cooled down to 900° C. at a cooling rate of 0.5° C./h after placing a $YBa_2Cu_3O_y$ phase therein as a seed crystal.

After crystal growth, oxygen annealing was applied thereto in an oxygen flow at 400° C. under one atmosphere pressure for 250 hours.

Then, artificial through-holes (0.8 mm in diameter) were bored in respective bulk superconductors, using a drill. The through-holes were provided at three spots located between the center of the respective bulk superconductors, in the direction of the c-axis thereof, and the periphery thereof.

Subsequently, an aluminum bar (a soft wire-like bar 0.7 mm in diameter) was inserted into the respective artificial through-holes as bored, and respective ends of the aluminum bars were kept in such a condition as to be exposed to the outside.

The respective bulk superconductors were immersed in a silane based coupling agent {R' Si (OR)$_3$: R' is an organic functional group, and OR is an inorganic functional group}, and were put in a vacuum tank so as to be in a condition of reduced pressure at $6.7 \times 10^{-2}$ Pa, subsequently, reverting to a condition under atmospheric pressure. Then, the respective bulk superconductors were put in a drying furnace to be dried.

The respective bulk superconductors were preheated up to 100° C., a liquid metal having chemical composition of 57% Bi—17% Sn—26% In also at 100° C. was poured so as to accumulate at the bottom of the respective bulk superconductors, and the pressure was reduced to $6.7 \times 10^{-2}$ Pa in the vacuum tank to be subsequently increased up to 0.3 MPa. Thereafter, the temperature was lowered down to normal temperature (20° C.), thereby solidifying the liquid metal.

Next, the respective bulk superconductors were cooled down to 100K, a magnetic field with a magnetic flux density at 13 T was applied thereto, the respective bulk superconductors were further cooled down to 50K, and subsequently, a magnetic field on the respective surfaces of the bulk superconductors was measured by use of the Hall sensor device while lowering the magnetic field from 13 T.

As a result, the specimens having a Y211 phase content of 0, 10, 20, 30, and 40%, trapped magnetic flux densities of 5 T, 8 T, 7 T, and 5 T, respectively.

On the other hand, when the same measurements as described above were conducted on specimens wherein vacuum treatment with a low melting metal was not applied after providing the artificial holes, it was found that the trapped magnetic fields of those specimens having a Y211 phase content of 20, 30, and 40%, showed magnetic flux density values of 1 T, 2 T, and 1.5 T, respectively.

As described in the foregoing, with all the specimens wherein treatment of impregnation with the low melting metal was applied after providing the artificial holes and installing the aluminum bar therein, relatively large trapped magnetic fields were obtained as compared with the specimens to which such treatment was not applied.

Further, it was found by post-test observation with a microscope that the space between the aluminum bar and the respective bulk superconductors, inside the respective artificial holes, was filled with the low melting metal and internal microcracks in the vicinity of the respective artificial holes were also filled with the low melting metal.

Further, it was confirmed that the mechanical strength was also concurrently enhanced by applying the vacuum treatment with the low melting metal.

Thus, the present invention can provide a superconducting magnet made of a high-temperature bulk superconductor which is capable of efficiently securing a high trapped magnetic field in a relatively short time and can bring about very useful effects from the industrial viewpoint in that there can be expected a great contribution made to enhancement in performance of equipment to which the high-temperature bulk superconductor is applied, for example, a magnetic levitation train, superconducting bearings for use in flywheel energy storage, a magnetic separation apparatus, and so forth.

What is claimed is:

1. A superconducting magnet comprising a high-temperature bulk superconductor body having internal microcracks and voids and an artificial hole provided therein, said artificial hole extending from the surface into the interior of the bulk superconductor body and being filled with a heat conducting metal material covered by a low melting metal or metal alloy, some of the internal microcracks and voids also containing the low melting metal or metal alloy and being in thermal communication with the low melting metal or metal alloy contained in the artificial hole.

2. The superconducting magnet according to claim 1, wherein the heat conducting metal material is made of an element selected from the group consisting of Al, Cu, Ag, and Au.

3. The superconducting magnet according to claim 1, wherein said heat conducting metal material is provided in the artificial hole in the form of a wire.

4. The superconducting magnet according to claim 1, wherein the outside surface of the bulk superconductor body is coated with the low melting metal or metal alloy.

5. The superconducting magnet according to claim 3, wherein an end of the wire is splayed and provided on the surface of the bulk superconductor body.

6. The superconducting magnet according to claim 5, wherein a coating of the low melting metal is provided on the splayed end of the wire.

7. The superconducting magnet according to claim 1, wherein the artificial holes extend from the surface of the bulk superconductor body to an opposite surface of the bulk superconductor body.

8. The superconducting magnet according to claim 1, wherein the heat conducting metal material is made of an element selected from the group consisting of Al, Cu, Ag and Au and the low melting metal has a melting point of no greater than 300° C.

9. The superconducting magnet according to claim 8, wherein the low melting metal has a melting point of no greater than 250° C.

10. The superconducting magnet according to claim 9, wherein the low melting metal has a melting point of no greater than 200° C.

* * * * *